March 17, 1970 J. J. DI GIACOMO 3,501,647
EMITTER COUPLED LOGIC BIASING CIRCUIT
Filed Sept. 8, 1966
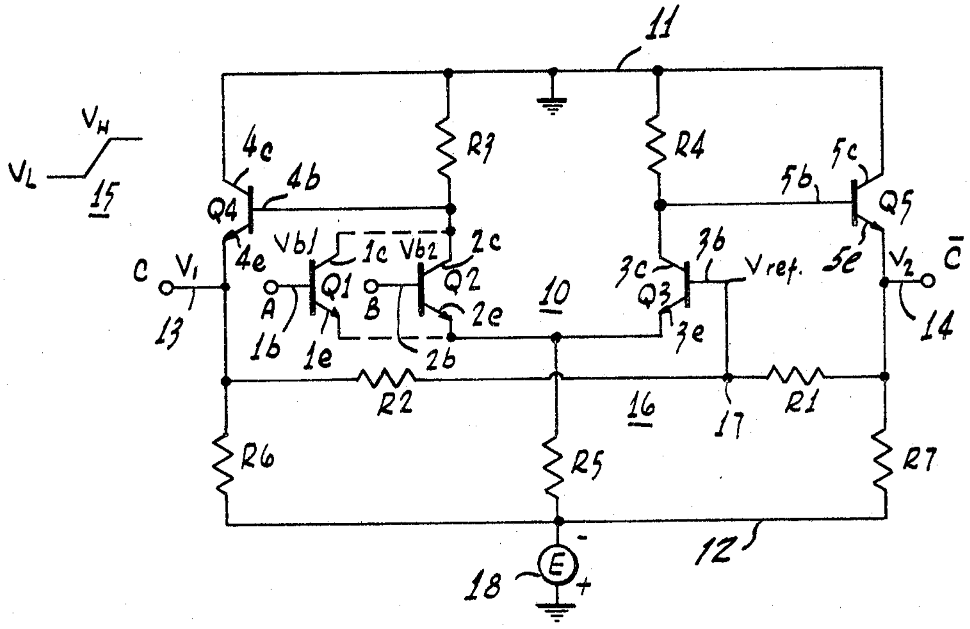
INVENTOR
JOSEPH JOHN DI GIACOMO
BY John V. Regan
ATTORNEY

United States Patent Office 3,501,647

Patented Mar. 17, 1970

3,501,647

EMITTER COUPLED LOGIC BIASING CIRCUIT

Joseph John Di Giacomo, King of Prussia, Pa., assignor to RCA Corporation, a corporation of Delaware Filed Sept. 8, 1966, Ser. No. 578,002
Int. Cl. H03k *19/40*
U.S. Cl. 307—214 7 Claims

ABSTRACT OF THE DISCLOSURE

An emitter coupled logic circuit comprising a differential amplifier having first and second input points and first and second differential output points. The first and second differential output points are respectively coupled by emitter followers to first and second output signal points. Two resistors of unequal value are connected in series between the first and second signal output points and their junction point is connected to the second input point. In response to binary signal applied to the first input electrode, the amplitude of the voltage at the second input point varies by an amount determined by the ratio of the two resistors.

This invention relates to switching circuits and, in particular, to novel current mode switching circuits useful as logic gates in digital systems.

Current mode switching circuits are well suited for high speed digital systems, for example electronic computers and other electronic apparatus, since the transistors therein can be operated out of saturation with relatively small voltage swings, which may be on the order of a fraction of a volt or so. The avoidance of transistor saturation and the small voltage excursions enable current mode switching circuits to have a high speed of response.

One known type of current mode switching circuit includes at least two transistors having separate collector circuits and a common emitter circuit in which a current source is connected. The current source current can be routed through either one of the alternate current paths provided by the collector-to-emitter paths of the transistors by application of a suitable difference in potential between the base electrodes thereof. When this type of current mode switching circuit is utilized as a logic gate, the difference in potential is achieved by applying relatively high (HI) and relatively low (LO) binary signal voltage levels to one transistor base electrode and a reference voltage ($V_{ref}$) to the other transistor base electrode. A value intermediate the HI and LO signal levels is assigned to $V_{ref}$, so that the potential difference between the two signal levels and $V_{ref}$ controls which of the transistors the current is routed through. This type of logic gate is sometimes called a current mode logic (CML) gate.

In the usual type CML gate the voltage $V_{ref}$ is a fixed voltage derived by means of a voltage divider arrangement connected across the power supply of the gate. The present invention is directed to novel improvements in CML gates whereby the voltage $V_{ref}$ is controlled by means of a feedback arrangement such that the D.C. noise margin is a function of the output signal swing.

An object of the present invention is to provide novel and improved current mode switching circuits.

Another object is to provide a novel and improved current mode logic circuit.

Still another object is to provide a CML gate wherein the voltage $V_{ref}$ is a function of the signal swing.

In accordance with an illustrated example of the present invention, a voltage divider means is connected across the complementary output connections of a current mode switch. The voltage $V_{ref}$ for the current mode switch is derived from an intermediate point of the voltage divider means. The voltage divider means may take on the form of a pair of serially connected resistors with their common connection point providing the voltage $V_{ref}$. In one embodiment of the invention the two resistors are equal in value to thereby provide a voltage $V_{ref}$ which is symmetrical with regard to the HI and LO output voltage levels no matter what the temperature, component tolerances or power supply conditions are. In another embodiment of the invention the two resistors are unequal in value thereby providing a hysteresis type operation for the CML gate.

Referring now to the sole figure, there is illustrated a current mode switching circuit which includes a current mode switch 10 and a voltage divider means 16. The current mode switch 10 includes a pair of transistors Q2 and Q3 having their emitter electrodes *2e* and *3e* connected in comon and by way of a common emitter resistor R5 to a supply connection 12. The base electrode *2b* is connected to receive binary signals B. The collector electrodes *2c* and *3c* are connected by way of resistors R3 and R4, respectively, to a supply connection 11.

The collector electrodes *2c* and *3c* are further connected to the base electrodes *4b* and *5b* of transistors Q4 and Q5, respectively, which are both connected in the common collector configuration. The collector electrodes *4c* and *5c* are connected to the supply connection 11, while the emitter electrodes *4e* and *5e* are connected by way of resistors R6 and R7, respectively, to the supply connection 12. Emitter electrodes *4e* and *5e* are further connected to output connections 13 and 14, respectively, at which complementary output signals C and C, respectively, are developed.

Additional inputs to the current mode switching circuit may be provided by connecting the collector and emitter electrodes of additional transistors in parallel with the collector electrode *2c* and emitter electrode *2e* of transistor Q2. For example, as illustrated by the dashed connections, further transistor Q1 has its collector electrode *1c* connected to the collector electrode *2c* and its emitter electrode *1e* connected to the emitter electrode *2e*. The base electrode *1b* is connected to receive further binary input signals A.

The voltage divider arrangement 16 includes a pair of impedance elements such as the illustrated resistors R1 and R2 serially connected across the output connections 13 and 14. The common connection 17 of the resistors R1 and R2 is connected to the base electrode *3b* to provide the voltage $V_{ref}$ for the current mode switch 10. The current mode switching circuit thus far described may be fabricated as an article in integrated circuit structures or modules. In fact, an array of the above-described circuits may be fabricated in a single chip of semi-conductor material and interconnected to perform various logical and switching functions which might be required by a particular digital system. However, the above-described circuit may also be fabricated with discrete components.

For use in an electrical circuit, a suitable source 18 of operating voltage of value E is connected between the supply connections 11 and 12. For the illustrated NPN type transistors, the source 18 has its negative terminal connected to the supply connection 12 and its positive terminal connected to the supply connection 11, with the supply connection 11 being arbitrarily connected to a suitable reference potential, illustrated as circuit ground by the conventional symbol. When PNP type transistors are utilized in the current mode switching circuit, the polarity of source 18 would be reversed.

The binary input signals A and B and the output signals C and $\bar{C}$ have the well-known form of HI and LO voltage levels with transitions therebetween as illustrated by the waveform 15 in FIGURE 1. As there illustrated, the HI and LO voltage levels are considered to have values of $V_H$ and $V_L$, respectively. The signals A and B may be derived, e.g., from the outputs of other similar current mode switching circuits connected in the digital system.

Due to the voltage divider arrangement 16, the voltage $V_{ref}$ can be expressed as a function of resistors R1 and R2 and the voltage levels $V_H$ and $V_L$:

$$V_{ref.}=V_H-\left[\left(\frac{R}{R1+R2}\right)(V_H-V_L)\right] \quad (1)$$

where $R=R1$ when $V_C=V_H$; and $R=R2$ when $$V_{\bar{C}}=V_H$$

The quantity $$\left(\frac{R}{R1+R2}\right)$$

has boundary values of 0 and 1 and is preferably a fraction. For example, when R1 and R2 are equal, $$\frac{R}{R1+R2}=\tfrac{1}{2}$$

and $V_{ref}$ has a value midway between the HI and LO voltage levels.

In the operation of the current mode switching circuit the common emitter resistor R5 and the voltage source 18 simulate a source of current for the current mode switch 10. When either or both of the base voltages $V_{b1}$ or $V_{b2}$ is more positive than the voltage $V_{ref}$ at the base electrode 3*b* (that is, $V_{b1}$ and/or $V_{b2}$ equal to $V_H$), the transistor Q1 and/or Q2, as the case may be, is turned on and the transistor Q3 is turned off. The current source current is routed through the collector-to-emitter path of transistor Q1 and/or Q2, as the case may be, with the result that the voltage at the collector electrode 2*c* is at a relatively low level, while the voltage at collector electrode 3*c* is at a relatively higher level. These relatively low and high voltage levels at collector electrodes 2*c* and 3*c* are translated with level shift by the base-emitter junctions of transistors Q4 and Q5 to the output connections 13 and 14, respectively, such that the output signals C and $\bar{C}$ are at the LO and HI levels, respectively.

On the other hand, when both of the base voltages $V_{b1}$ and $V_{b2}$ are less positive than the voltage $V_{ref}$ (that is, $V_{b1}$ and $V_{b2}$ equal to $V_L$), the transistors Q1 and Q2 are turned off and the transistor Q3 is turned on. The current source current is routed through the collector-to-emitter path of the transistor Q3 with the result that the voltage at the collector electrode 3*c* is at a relatively low level; while the voltage at collector electrode 2*c* is a relatively higher level. These relatively low and high voltage levels at collector electrodes 3*c* and 2*c* are translated with level shift by the base-emitter junctions of transistors Q5 and Q4 to the output connections 14 and 13, respectively, such that the output signals C and $\bar{C}$ are at the HI and LO levels, respectively.

In summary, whenever either or both of the input signals A and B is at the HI level, the output C is at the LO level. It is only when both binary input signals A and B are at the LO level that the output signal C is at the HI level. Of course, the output signal $\bar{C}$ is the complement of the output signal C in each of the above cases. If the binary symbols "1" and "0" are assigned to the HI and LO levels, respectively, the circuit can be said to function as a NOR gate with respect to the output signal C and as an OR gate with respect to the output signal $\bar{C}$. On the other hand, if the binary symbols "1" and "0" are assigned to the LO and HI levels, respectively, the circuit can be said to function as a NAND gate with respect to the output signal C and as an AND gate with respect to the output signal $\bar{C}$.

In addition to providing a level shift function, emitter follower transistors Q4 and Q5 further provide the current mode switching circuit with a low output impedance thereby enabling the circuit to have a large-fan-out capability.

As mentioned previously when $R1=R2$, the quantity $$\left(\frac{R}{R1+R2}\right)=\tfrac{1}{2}$$

and $V_{ref}$ has a value midway between the HI and LO voltage levels. In fact, the value of $V_{ref}$ then is always midway between or symmetrical with respect to the HI and LO levels no matter what the temperature, component tolerances, and power supply conditions are. For example, if $V_H$ and $V_L$ vary with temperature at rates of 2 and 1 millivolt per degree centigrade, respectively, $V_{ref}$ varies at a rate of 1.5 millivolts per degree centigrade. Thus, when the circuit is designed with $R1=R2$, the voltage $V_{ref}$ is always midway between the HI and LO voltage levels, thereby providing a predictable and reliable D.C. noise margin which is ½ of the signal swing.

When R1 and R2 are unequal, the circuit operates with a hysteresis effect. For example if $R2=2R1$, $$V_{ref}=V_H-\frac{V_H-V_L}{3} \quad (2)$$

for $V_{b1}=V_{b2}=V_L$ and $V_C=V_H$; and $$V_{ref}=V_H-\frac{2}{3}(V_H-V_L) \quad (3)$$

for $V_{b1}$ or $$V_{b2}=V_{\bar{C}}=V_H$$

Thus, when the input signals A and B are both at the LO level, $V_{ref}$ has a value less than $V_H$ by ⅓ of the signal swing. On the other hand, when either of the input signals A or B is at the HI level, $V_{ref}$ has a value less than $V_H$ by ⅔ of the signal swing. It is evident that the input signal must traverse ⅔ of the signal swing before the CML gate switches, thereby resulting in improved D.C. noise margin while slightly decreasing the switching speed. By making R1 larger than R2, the inverse is true, i.e., the switching speed is improved at the expense of loss in D.C. noise margin.

While the invention has been illustrated with a specific CML gate, it should be apparent that the invention is applicable to other CML gate circuits. Thus, instead of providing additional inputs in the manner illustrated by the dash connections, the signal B may itself be derived from one or a combination of other binary signals. For example, a plurality of transistors may be provided each connected in the emitter follower configuration with a common emitter connection to the base electrode 2*b*. For such a configuration, binary input signals are applied to the base electrodes of the emitter follower input transistors whereby the signal B is determined by combinations thereof.

It should be further apparent that the source of current for the current mode switch may take on forms other than the illustrated resistor R5 and voltage source 18. For example, the resistor R5 could be replaced by a transistor which is biased in the linear mode to provide a substantially constant current.

What is claimed is:

1. A differential amplifier having first and second differential output points and first and second input points;
   - means for coupling binary signals into said first input point causing said first and second output points to be "high" and "low" respectively for one value of input signal and for causing said first and second output points to be "low" and "high" respectively for the other value of input signal;
   - first means including a first resistor having a first ohmic value for coupling said first differential output point to said second input point; and
   - second means including a second resistor having a substantially different ohmic value than said first resistor for coupling said second differential output point to said second input point, said second input point being at a first voltage level for one condition of output voltage and at a second voltage level for the other condition of output voltage.

2. The combination as claimed in claim 1 wherein the junction point common to said first and second resistors and said second input point is returned to ground solely via resistive means.

3. The combination as claimed in claim 1 wherein said differential amplifier includes first and second transistors, each transistor having a base, an emitter, and a collector; wherein the base of said first transistor is connected to said first input point and the base of said second transistor is connected to said second input point, and wherein the collector of said first transistor is connected to said first differential output point and the collector of said second transistor is connected to second differential output point.

4. The combination as claimed in claim 3 wherein said first means includes a third transistor and said second means includes a fourth transistor each transistor having a base, an emitter and a collector; said transistors being connected as emitter followers, wherein the base of said third transistor is connected to said first differential output point and its emitter is connected to said first resistor and wherein the base of said fourth transistor is connected to said second differential output point and the emitter of said fourth transistor is connected to said second resistor.

5. A differential amplifier having first and second differential output points and first and second input points;

resistance means;

means for coupling said resistance means between said first and second output points;

means for coupling said first input point to a source of input signal; and means for coupling said second input point to an intermediate point on said resistance means wherein the resistance between said second input point and said first differential output point is not equal to the resistance between said second input point and said second differential output point and wherein said intermediate point is returned to ground solely via resistive means.

6. The combination as claimed in claim 5 wherein the resistance between said second input point and said first differential output point is greater than the resistance between said second input point and said second differential output point.

7. The combination as claimed in claim 5 wherein the resistance between said second input point and said second differential output point is greater than the resistance between said second input point and said first differential output point.

References Cited

UNITED STATES PATENTS 3,404,285 10/1968 Hazlett ____________ 307—215 X

DONALD D. FORRER, Primary Examiner

U.S. Cl. X.R.

307—215; 330—30